(12) United States Patent
Kim

(10) Patent No.: US 8,288,190 B2
(45) Date of Patent: Oct. 16, 2012

(54) METHODS OF MAKING HETEROJUNCTION DEVICES

(75) Inventor: Eui-Tae Kim, Daejeon (KR)

(73) Assignee: The Industry & Academic Cooperation in Chungnam National Universtiy (IAC), Daejeon (KR)

( * ) Notice: Subject to any disclaimer, the term of this patent is extended or adjusted under 35 U.S.C. 154(b) by 0 days.

(21) Appl. No.: 13/027,821

(22) Filed: Feb. 15, 2011

(65) Prior Publication Data

US 2012/0193610 A1    Aug. 2, 2012

(30) Foreign Application Priority Data

Jan. 28, 2011   (KR) .................. 10-2011-0008705

(51) Int. Cl.
*H01L 21/00* (2006.01)

(52) U.S. Cl. .............. 438/50; 438/51; 438/52; 977/734; 977/742; 977/774; 977/948

(58) Field of Classification Search .............. 438/50–52; 257/415; 977/734, 742
See application file for complete search history.

(56) References Cited

U.S. PATENT DOCUMENTS

| | | | |
|---|---|---|---|
| 2009/0325507 A1* | 12/2009 | Trachewsky et al. | 455/73 |
| 2010/0025660 A1* | 2/2010 | Jain et al. | 257/24 |
| 2011/0220191 A1* | 9/2011 | Flood | 136/255 |
| 2012/0006580 A1* | 1/2012 | Sandhu | 174/126.1 |

* cited by examiner

*Primary Examiner* — Dung A. Le
(74) *Attorney, Agent, or Firm* — Edwards Wildman Palmer LLP

(57) ABSTRACT

The present invention provides methods of making junction devices, such as, fabrication methods. In certain embodiments, the junction device is a graphene/oxide semiconductor Schottky junction device or graphene/oxide semiconductor p-n heterojunction device. In certain instances, the Schottky junction device comprises graphene vapor-deposited directly on thin films, nanowires, nanotubes, nanobelts or nanoparticles, while the p-n heterojunction device is manufactured by doping the graphene of the Schottky junction device.

11 Claims, 7 Drawing Sheets

METHODS OF MAKING HETEROJUNCTION DEVICES

CROSS-REFERENCES TO RELATED APPLICATION

This application claims under 35 U.S.C. §119(a) the benefit of Korean Patent Application No. 10-2011-8705 filed on Jan. 28, 2011, the entire disclosure of which is incorporated by reference herein.

BACKGROUND OF THE DISCLOSURE

1. Technical Field

The present disclosure relates to graphene/oxide semiconductor heterojunction devices and a fabrication method thereof. More particularly, it relates to a Schottky junction device, a p-n heterojunction device, and fabrication methods thereof.

2. Related Art

Graphene is a two-dimensional hexagonal crystal structure of $sp^2$-bonded carbon atoms and has been reported to have interesting physical and electrical properties, including electrons that behave like massless Dirac fermions, and anomalous hall effects. Thus, in recent years, studies on the preparation of high-quality graphene and on the application of graphene to devices have been actively conducted.

Graphene have been prepared by a mechanical exfoliation method, a chemical method employing a reducing agent, and an epitaxial method employing a silicon carbide insulator.

In the mechanical exfoliation method, graphene is prepared from highly ordered pyrolytic graphite (HOPG) using a very delicate mechanical exfoliation technique. In the chemical method, highly ordered pyrolytic graphite (HOPG) is chemically exfoliated using a strong acid in a liquid state, a graphene oxide film resulting from the exfoliated graphite is deposited on a substrate, and then the deposited graphene oxide film is subjected to chemical reduction to produce a large-area graphne. In the epitaxial method, epitaxial graphene is prepared on a SiC (0001) substrate by vacuum heat treatment. However, these methods have disadvantages, for example, in that the electrical properties of graphene are not good, the substrate that can be used is limited, and/or a non-uniform graphene layer is formed.

In recent years, a chemical vapor deposition (CVD) method has been used to prepare graphene. In the CVD method, grapheme is chemically vapor-deposited on a metal substrate such as Ni or Cu using methane gas. This method requires a process of exfoliating graphene grown on such a metal substrate and transferring the exfoliated graphene onto a desired oxide and semiconductor substrate, which cause the whole process to become very complicated and the interface between graphene and the substrate to have defects that can significantly deteriorate the behavior characteristics of a device manufactured using the graphene/substrate.

Thus, a technique of growing graphene directly on an oxide or a semiconductor is still required.

SUMMARY OF THE DISCLOSURE

In one aspect, the present invention provides a Schottky junction device comprising graphene vapor-deposited directly on thin films, nanowires, nanotubes, nanobelts or nanoparticles.

In another aspect, the present invention provides a p-n heterojunction device that is fabricated by doping the graphene of the Schottky junction device to be converted into a semiconductor.

In still another aspect, the present invention provides a method for fabricating a junction device. The method may comprise the steps of: (A) providing a support plate on which thin films, nanowires, nanorods, nanotubes, nanobelts or nanoparticles are formed; and (B) vapor-depositing graphene on the thin films, nanowires, nanorods, nanotubes, nanobelts or nanoparticles formed on the support plate. In an embodiment, the method may further comprise, after step (B), step (C) of applying a dopant such that the graphene is converted into a p-type or n-type semiconductor.

The above and other aspects of the present invention are discussed in detail below.

BRIEF DESCRIPTION OF THE DRAWINGS

The above and other objects, features and advantages of the present invention will be more clearly understood from the following detailed description taken in conjunction with the accompanying drawing illustrating embodiments of the present invention, in which.

DETAILED DESCRIPTION OF EMBODIMENTS

Figure 1:
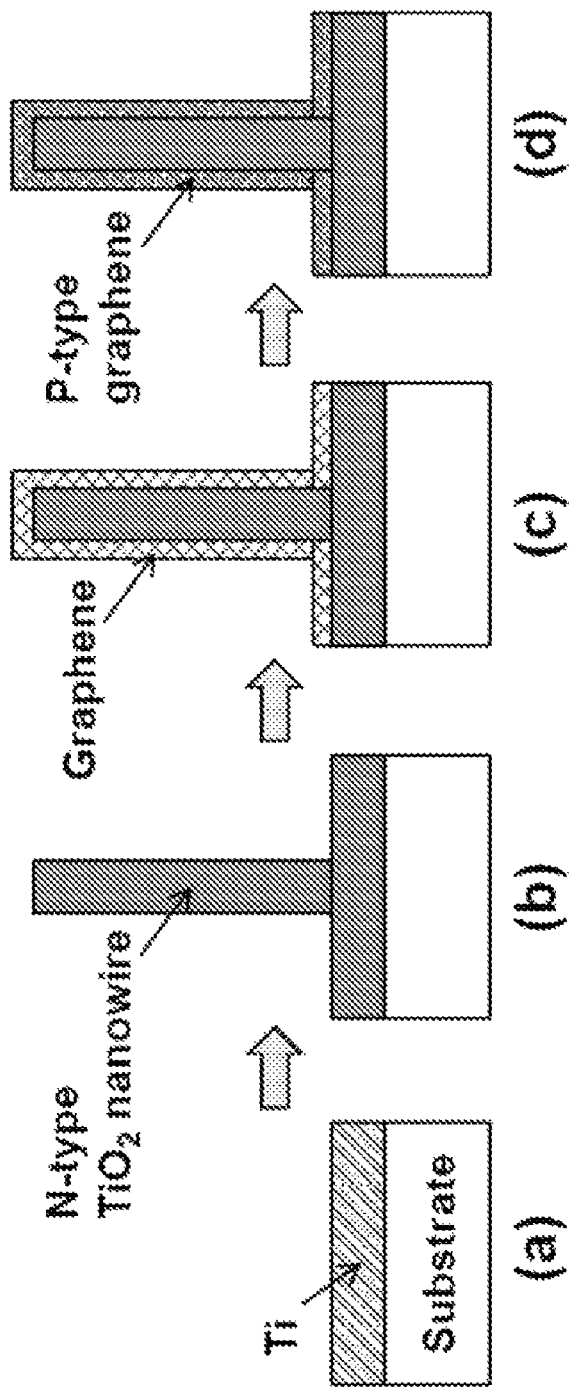
FIG. 1 illustrates the preparation of Ti/substrate (a), the preparation of n-type semiconductor $TiO_2$ nanowires (b), the structure of a graphene (conductor)/$TiO_2$ (n-type) Schottky junction device fabricated by growing graphene directly on the $TiO_2$ nanowires (c), and the structure of a graphene (p-type)/$TiO_2$ (n-type) heterojunction p-n device fabricated by doping boron into the graphene.

Hereinafter, the present invention will be described in further detail with reference to the accompanying drawings, preliminary experiments and examples. It is to be understood, however, that these drawings, preliminary experiments and examples are for illustrative purposes only and are not to be construed to limit or change the scope of the present invention. Also, those skilled in the art will appreciate that various modifications, additions and substitutions are possible based on this illustration, without departing from the scope and spirit of the invention.

As discussed above, the present invention provides graphene/oxide semiconductor heterojunction devices and fabrication methods thereof. More particularly, it provides a graphene/oxide semiconductor Schottky junction device, a graphene/oxide semiconductor p-n heterojunction device, and fabrication methods thereof. As detailed below, according to embodiments of the present invention, a graphene (conductor)/oxide semiconductor Schottky junction device is fabricated by growing graphene directly on a substrate using a chemical vapor deposition method, and a semiconductor device fabricated by forming a graphene (p-type)/oxide semiconductor (n-type) or graphene (n-type)/oxide semiconductor (p-type) heterojunction is fabricated through graphene modification (doping).

(1) Junction Devices

Examples of the junction devices that can be prepared according to the present invention include a Schottky junction device and a p-n heterojunction device. The Schottky junction device comprises graphene vapor-deposited directly on a thin film(s), nanoparticles, or a one-dimensional nanostructure. The one-dimensional nanostructure may be formed of, e.g., nanowires, nanorods, nanotubes, or nanobelts. The p-n heterojunction device may be fabricated by doping the graphene of the Schottky junction device to modify the graphene into a p-type or n-type semiconductor.

The source of graphene may preferably be a C1-C7 hydrocarbon, such as methane, methanol, ethanol or acetone.

The thin film(s), nanoparticles, and one-dimensional nanostructure may suitably be made of $TiO_2$, $ZnO$, $Fe_2O_3$, a similar oxide which is known in the art or will be developed in the future, or a n-type or p-type semiconductor, such as Si, Ge, GaAs, InAs, InP or SiC.

Examples of a dopant that can be used for doping the graphene to form a p-type or n-type semiconductor graphene may include, but not limited to, B, Li, Be, N, O, F, Na, Mg, Al, P, S, and Cl. Preferably, for example, groups I, II and III elements (B, Li, Be, Na, Mg, Al, etc.) of the periodic table may be used for p-type graphene doping, and groups V, VI and VII elements (N, O, F, P, S, Cl, etc.) of the periodic table may be used for n-type graphene doping.

(2) Methods for Fabricating Devices

The present invention also provides method for manufacturing the junction devices.

For example, the Schottky junction device is manufactured by the method comprising the steps of: (A) providing a substrate on which a thin film(s), nanoparticles, a one-dimensional nanostructure, or any combination thereof is/are formed; and (B) vapor-depositing graphene on the thin film (s), nanoparticles, one-dimensional nanostructure, or any combination thereof.

The thin film(s), nanoparticles, one-dimensional nanostructure, or any combination thereof may be formed on a substrate by using various methods known in the art.

The substrate that is used in the present invention may be an element of the junction devices. Alternatively, it may be a separate plate that can support the thin film(s), nanoparticles, one-dimensional nanostructure, or any combination thereof during the fabrication process, and the material thereof thus is not limited.

The step (B) is preferably carried out at a temperature of 900-1300° C. and a pressure of 700-1400 torr.

The p-n heterojunction device is manufactured by the method further comprising, after step (B) of the above-described method, step (C) of doping the graphene to convert the graphene into a p-type or n-type semiconductor. This method, preferably, may further comprise, before step (C), a step of activating the graphene surface by plasma treatment.

Examples of a dopant that can be used to dope the graphene to form a p-type or n-type semiconductor graphene may include, but not limited to, B, Li, Be, N, O, F, Na, Mg, Al, P, S and Cl.

The source of the dopant may be boric acid, and the doping may be carried out by chemical vapor deposition at a temperature of 300-1000° C.

In an embodiment of the present invention, a p-n heterojunction device is manufactured by using $TiO_2$ nanowires as nanostructures, methanol, ethanol and acetone as carbon sources for graphene growth, and boron (boric acid ($B(OH)_3$)) as a doping source. More particularly, as illustrated in FIG. 1, a Ti metal layer is deposited on a substrate by sputtering or vacuum deposition (FIG. 1(a)). The resulting substrate is placed in a heat-treatment furnace. Then, methanol of 5° C. is introduced into the heat-treatment furnace by bubbling with 150 SCCM of argon gas. While the heat-treatment furnace is maintained at a pressure of 1-100 torr and a temperature of 600-900° C., n-type semiconductor $TiO_2$ nanowires are grown (FIG. 1(b)). The growth time can be set depending on the desired length of the nanowires.

As nanowires having a suitable length and density are formed, the heat-treatment furnace is maintained at a pressure of 700-1400 torr and a temperature of 900-1300° C. while methanol of 5° C. is introduced into the heat-treatment furnace by bubbling with 150 SCCM of argon gas, whereby graphene is grown on the nanowires by chemical vapor deposition (FIG. 1(c)).

If the growth temperature of the graphene is lower than the lower limit of the above-described range, graphene having many crystal defects will be formed. On the other hand, if the growth temperature of the graphene is higher than the upper limit of the above-described range, undesired phases such as TiC can be formed at the graphene/$TiO_2$ nanowire boundary to deteriorate the characteristics of the semiconductor device.

The growth time of the graphene can be controlled depending on the desired graphene thickness. The graphene thus grown serves as a conductor and forms a conductor/semiconductor Schottky junction semiconductor device with the n-type semiconductor $TiO_2$.

The conductive graphene prepared as described above is then doped with boron so that it is modified into a p-type semiconductor (FIG. 1(d)). Specifically, the Schottky junction semiconductor device is treated with an RF power of 20-100 W at a temperature of 300-1000° C. in an atmosphere of argon and hydrogen plasma for 5 minutes or more to activate the graphene surface, and then doped with boron for 5 minutes or more under the above conditions. The activation process may suitably be omitted.

If the doping temperature is lower than the lower limit of the above-specified range, the boron source will not be decomposed so that the doping of the graphene cannot be achieved. In contrast, if the doping temperature is higher than the upper limit of the above-specified range, the graphene can be decomposed and damaged.

By this boron doping, the graphene is modified into a p-type semiconductor to form a semiconductor device having a graphene (p-type)/oxide semiconductor (n-type) p-n heterojunction.

As it is obvious to a person of ordinary skill in the art that same or similar result can be obtained by using different materials and resulting modified methods within the scope of the present invention (e.g., other structures such as nanobelts, nanorods, nanoparticles; other carbon source such as ethanol, acetone, and CH4 gas, and other doping source such as Na, Mg, P, S, Cl), detailed description thereof will be omitted.

EXAMPLES

The following examples illustrate the present invention and are not intended to limit the same.

1. Preparation of $TiO_2$ Nanowires

Methanol of 5° C. was introduced by bubbling with 150 SCCM of argon gas into a heat-treatment furnace in which a substrate sputtered with a Ti metal layer was placed. While the heat-treatment furnace was maintained at 700° C. and 7 torr, $TiO_2$ nanowires were grown on the substrate for 60 minutes.

Figure 2:
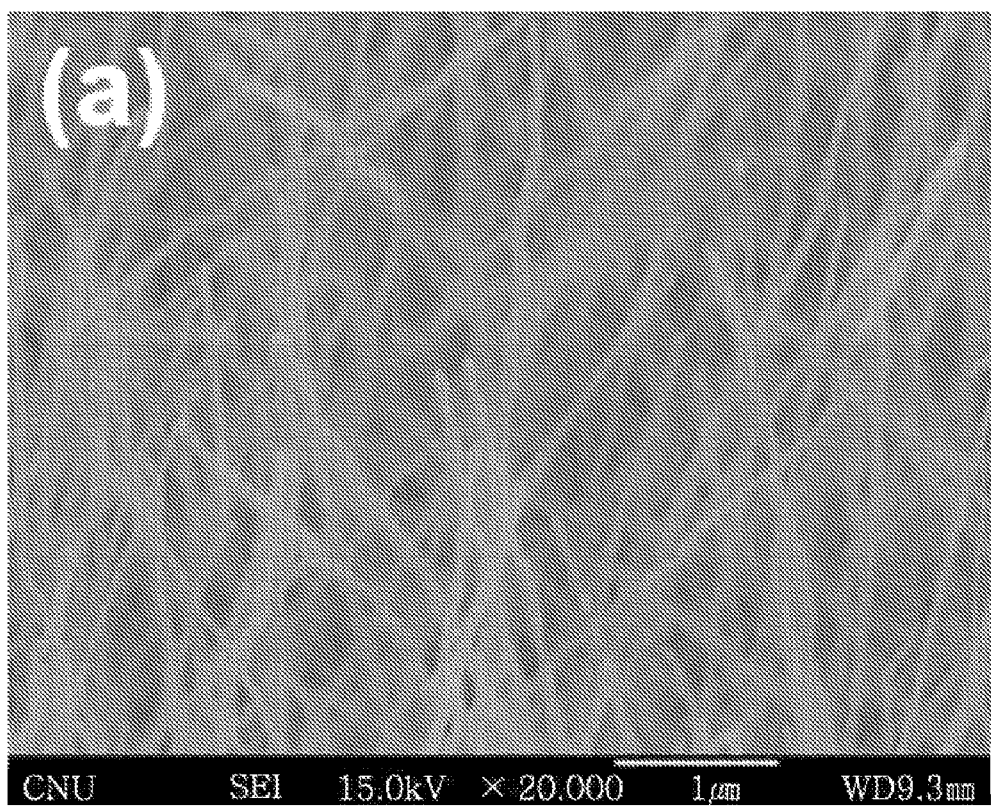
FIG. 2 is a set of scanning electron micrographs of $TiO_2$ nanowires (a), graphene/$TiO_2$ nanowires obtained by growing graphene for 5 minutes (b), and graphene/$TiO_2$ nanowires obtained by growing graphene for 60 minutes (c)
Figure 2:
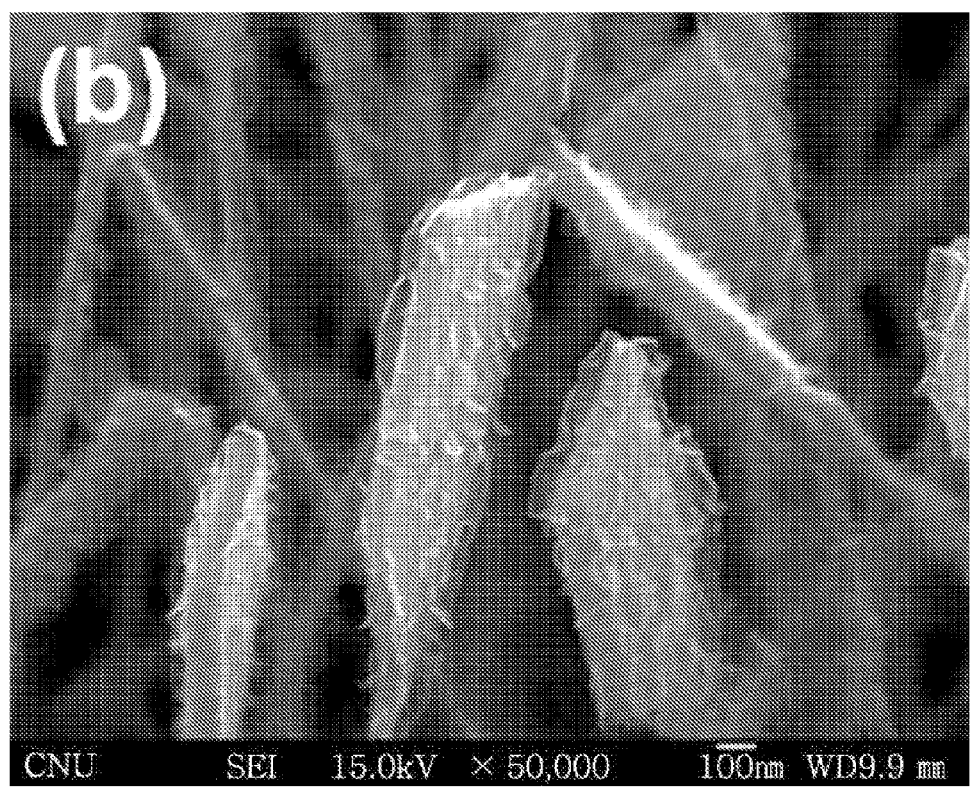
Figure 2:
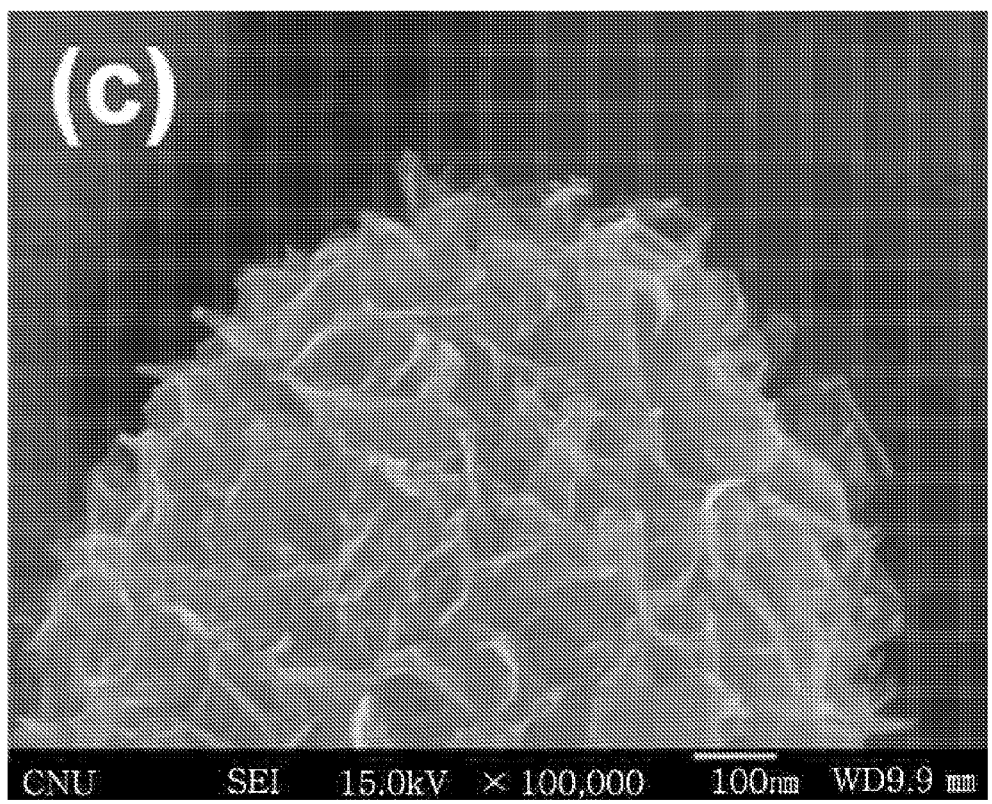

The substrate was analyzed with a scanning electron microscope (SEM), which shows that $TiO_2$ nanowires having a thickness of a few tens of nm were grown to a length of a few μm (FIG. 2(a)).

2. Graphene Formation (Graphene (Conductor)/Oxide Semiconductor Fabrication)

(1) While methanol of 5° C. was continuously introduced by bubbling with 150 SCCM of argon gas into the heat-treatment furnace in which the substrate having the $TiO_2$ nanowires formed thereon was placed, and while the heat-treatment furnace was maintained at 1000° C. and 1100 torr, graphene was grown on the nanowires by chemical vapor deposition for 5 minutes and 60 minutes, thus fabricating graphene (conductor)/oxide semiconductor samples.

The samples were analyzed with a scanning electron microscope (SEM), which shows that in the case in which the graphene was grown for 5 minutes, a very thin graphene layer was formed on the nanowires (FIG. 2(b)), and in the case in which the graphene was grown for 60 minutes, a graphene layer completely covering the nanowires was formed (FIG. 2(c)).

Figure 4:
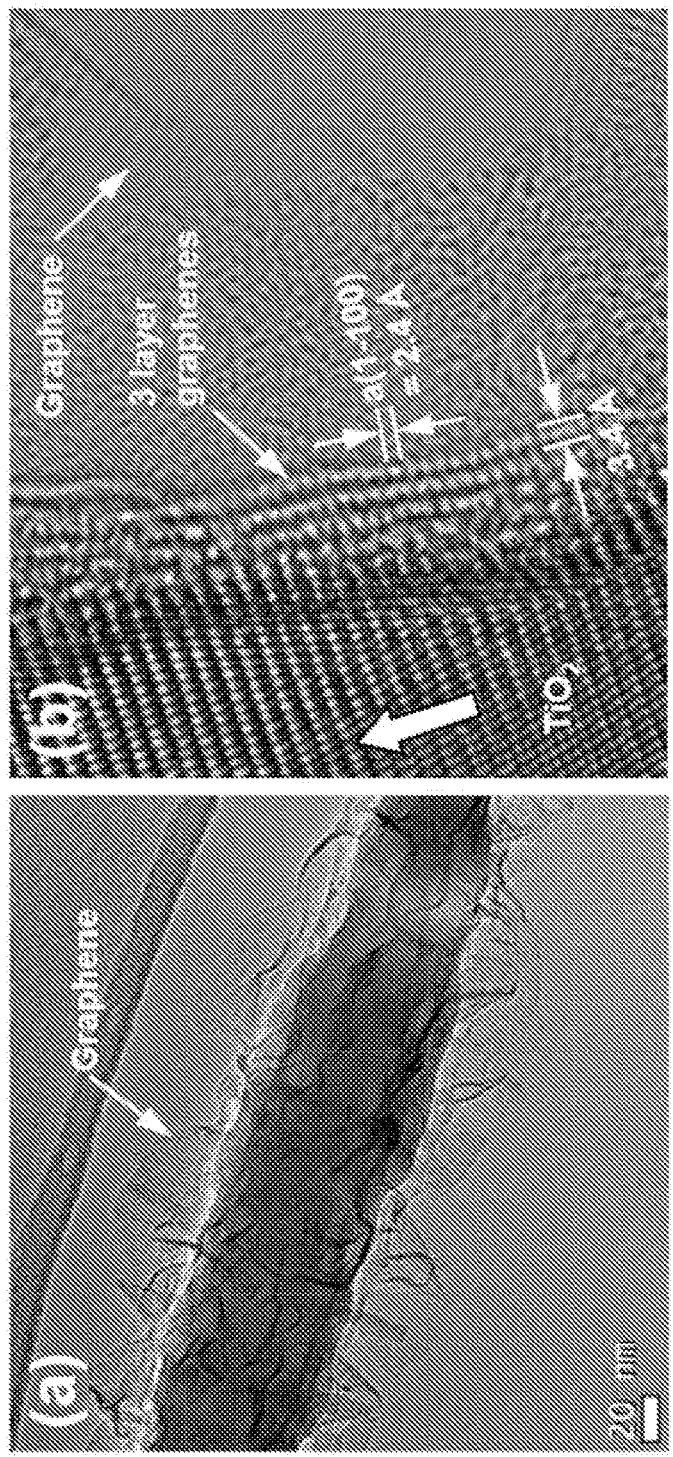
FIG. 4 shows a low-magnification transmission electron micrograph (a) and high-resolution transmission electron micrograph (b) of graphene/$TiO_2$ nanowires obtained by growing graphene for 5 minutes in the present invention, in which the arrows indicate the growth direction of $TiO_2$ nanowires.

The graphene (conductor)/oxide semiconductor sample obtained by growing graphene for 5 minutes was analyzed with a transmission electron microscope (TEM). In a low-magnification TEM photograph (FIG. 4(a)), it can be seen that graphene was formed on the $TiO_2$ nanowires, and in a high-resolution TEM photograph (FIG. 4(b)), it can be seen that about three graphene layers were coated on the $TiO_2$ nanowires.

Through the electron microscope observation as described above, it can be seen that one or more graphene layers (2-3 layers to 10 layers depending on the position) were coated throughout the $TiO_2$ nanowires.

(2) Spectral Analysis for Confirmation of Graphene

Using each of methanol, acetone and ethanol as a carbon source, graphene was grown on $TiO_2$ nanowires for 1 minute under the same conditions as described in the section (1) above, thus fabricating graphene (conductor)/oxide semiconductor samples.

Figure 3:
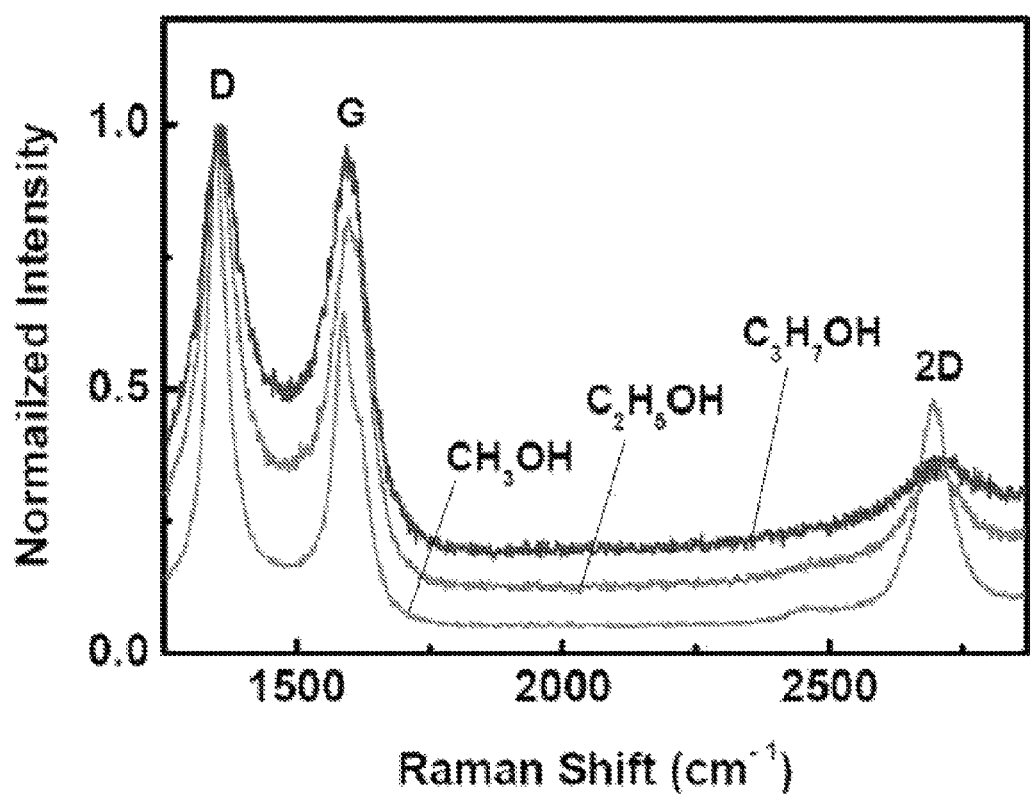
FIG. 3 shows the Raman spectrum of graphene/$TiO_2$ nanowires obtained by growing graphene at 1000° C. for 1 minute using each of methanol, ethanol and acetone.

In order to confirm whether the thin layer formed on the $TiO_2$ nanowires of the fabricated samples is graphene, Raman spectral analysis was carried out (FIG. 3). As a result, all the three samples clearly showed peaks associated with graphene at 1355 $cm^{-1}$ and 1590 $cm^{-1}$. The G band peak at 1590 $cm^{-1}$ occurred due to the phonon vibration of a structure of $sp^2$-bonded carbon atoms and shows that graphene was formed. On the other hand, the D band peak at 1355 $cm^{-1}$ occurred due to phonon vibration caused by a $sp^3$-bonded structure, bond-angle disorder, defects, etc.

The sample obtained using ethanol as the carbon source showed a relatively intense 2D band Raman peak at 2700 $cm^{-1}$, unlike the sample obtained using ethanol or acetone as the carbon source. This 2D band peak occurred due to lattice defects of finite size and shows that the use of methanol as the carbon source can produce a graphene having a more excellent crystal quality compared to the use of ethanol or acetone as the carbon source.

3. Graphene Modification-Fabrication of Graphene (Semiconductor)/Oxide Semiconductor The Conductor Graphene in the Graphene (Conductor)/Oxide semiconductor structure obtained by growing graphene for 5 minutes in Example 2(1) was doped with boron, so that it was modified into a p-type semiconductor graphene.

Specifically, the graphene surface of the graphene (conductor)/oxide semiconductor was activated with an RF plasma power of 30 W at a temperature of 500° C. at a pressure of 700 mtorr for 10 minutes while supplying 150 SCCM of a mixed gas of argon and hydrogen (10%). Then, boric acid was sublimed at 125° C. and supplied to the plasma reactor with 50 SCCM of argon gas while the conductor graphene was doped for 10 minutes. Herein, other conditions were not changed.

4. Characteristics of Semiconductor Devices

The characteristics of semiconductor devices comprising the graphene/oxide semiconductor ($TiO_2$) fabricated in the above Examples were analyzed using a holography TEM.

(1) Analysis of Sample Before Modification

Figure 5:
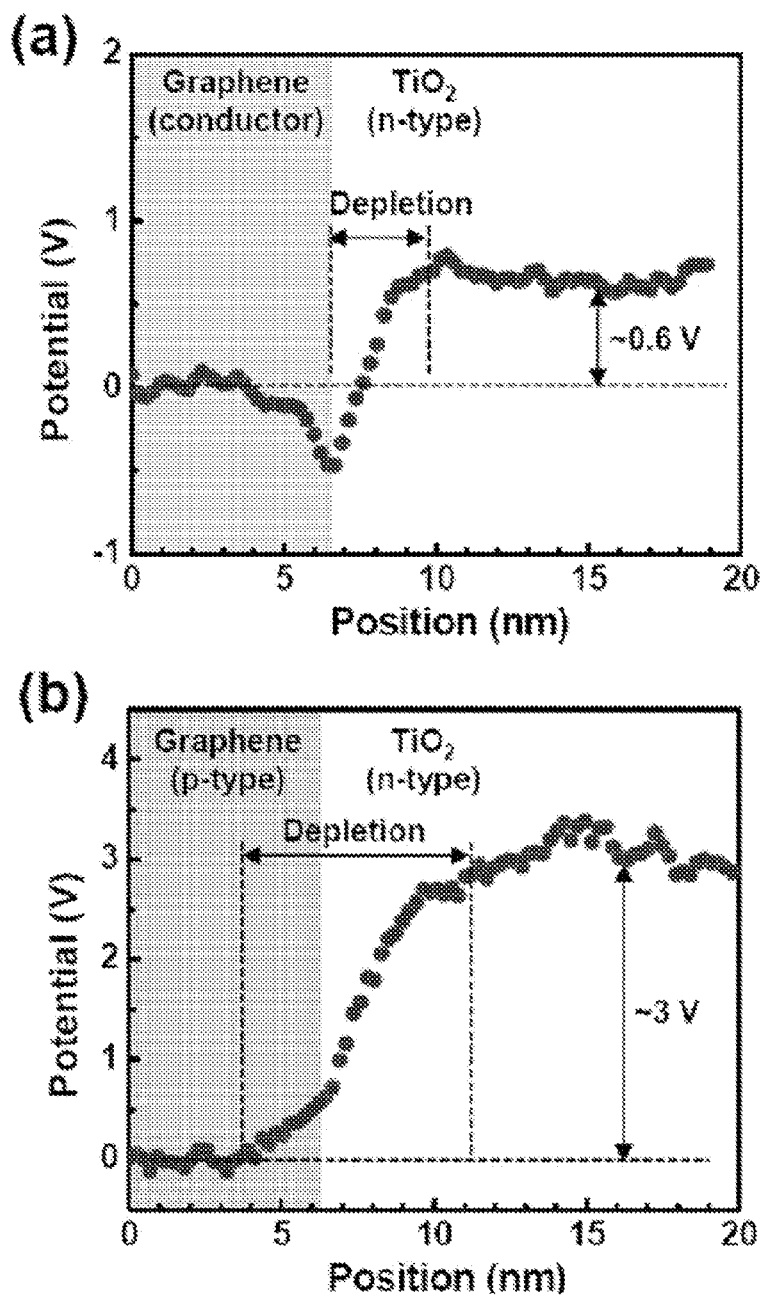
FIG. 5 shows potential distribution measured using a holography transmission electron microscope for a graphene (conductor)/$TiO_2$ (n-type oxide semiconductor) Schottky junction structure (a) and a graphene (p-type)/$TiO_2$ (n-type oxide semiconductor) p-n heterojunction device structure (b).

The potential distribution of the graphene/oxide semiconductor ($TiO_2$) before modification was measured using a holography TEM, and the results of the measurement are shown in FIG. 5(a). It can be seen that the graphene before modification was a conductor, $TiO_2$ was an n-type oxide semiconductor, and the graphene and the $TiO_2$ oxide semiconductor formed a Schottky junction. It can be seen that the difference in the Schottky junction potential of the graphene/$TiO_2$ nanowires was about 0.6 V. Also, the difference in potential at the boundary was increased to 1 V or more, and this seems to result from defect levels present at the interface.

(2) Analysis of Doped Sample

The graphene (p-type)/$TiO_2$ (n-type) heterojunction p-n semiconductor structure obtained by performing boron doping as described above was analyzed using a holography TEM, and the results of the analysis are shown in FIG. 5(b). As can be seen therein, the difference in the junction potential of the doped sample was about 3 V which was significantly greater than 0.6 V for the undoped sample (Schottky junction structure). This great difference in potential indicates that the graphene which had been a conductor was converted into a p-type semiconductor by boron doping, whereby the Schottky junction was changed to a p-n junction. Particularly, unlike the undoped sample (Schottky junction structure), depletion regions of about 7 nm could be observed not only in $TiO_2$, but also in the graphene. This clearly shows that the graphene was converted into the p-type semiconductor.

According to the present invention, a graphene (conductor)/oxide semiconductor Schottky junction device or a graphene (conductor)/oxide semiconductor p-n heterojunction device can be fabricated in a more cost-effective and simpler manner.

Although the preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for fabricating a junction device comprising the steps of:
   (A) providing a support plate, followed by forming a thin film, nanoparticles, or a one-dimensional nanostructure on the support plate, wherein said thin film, nanaoparticles, or one-dimensional nanostructure is made of metal oxide; and
   (B) vapor-depositing graphene on the thin film, nanoparticles, or the one-dimensional nanostructure on the support plate, wherein said vapor-depositing is carried out at a temperature of about 900 to about 1300° C.

2. The method of claim 1, wherein the one-dimensional nanostructure is formed of nanowires, nanorods, nanotubes, or nanobelts.

3. The method of claim 1, further comprising, after step (B), a step, as step (C), of applying a dopant to the graphene, thereby converting the graphene into a p-type or n-type semiconductor.

4. The method of claim 3, further comprising, between step (B) and step (C), a step of activating the surface of the graphene by plasma treatment.

5. The method of claim 3, wherein the dopant is B, Li, Be, N, O, F, Na, Mg, Al, P, S or Cl.

6. The method of claim 3, wherein the source of the dopant is boric acid, and application of the dopant is carried out by chemical vapor deposition at 300-1000° C.

7. The method of claim 4, wherein the dopant is B, Li, Be, N, O, F, Na, Mg, Al, P, S or Cl.

8. The method of claim 4, wherein the source of the dopant is boric acid, and the application of the dopant is carried out by chemical vapor deposition at 300-1000° C.

9. The method of claim 3, wherein said step of vapor-depositing graphene uses a carbon source containing C1-C7 hydrocarbons.

10. The method of claim 9, wherein said carbon source is selected from the group of methane, methanol, ethanol, and acetone.

11. The method of claim 1, wherein said one-dimensional nanostructure is formed of $TiO_2$ nanowires.

* * * * *